US007273339B2

(12) United States Patent
Johnson et al.

(10) Patent No.: US 7,273,339 B2
(45) Date of Patent: Sep. 25, 2007

(54) POWDER TRANSPORT METHOD AND APPARATUS

(75) Inventors: Jeffrey C. Johnson, Beverly Hills, MI (US); Jeffrey R. Joyce, Livonia, MI (US)

(73) Assignee: Haden Schweitzer Corporation, Auburn Hills, MI (US)

( * ) Notice: Subject to any disclaimer, the term of this patent is extended or adjusted under 35 U.S.C. 154(b) by 0 days.

(21) Appl. No.: 10/384,381

(22) Filed: Mar. 7, 2003

(65) Prior Publication Data

US 2004/0174862 A1 Sep. 9, 2004

(51) Int. Cl.
*H01L 21/67* (2006.01)

(52) U.S. Cl. ...................................... 414/217; 414/805

(58) Field of Classification Search ................ 414/805, 414/217

See application file for complete search history.

(56) References Cited

U.S. PATENT DOCUMENTS

| | | | | |
|---|---|---|---|---|
| 2,151,514 A * | 3/1939 | Heinen | ....................... | 414/221 |
| 2,667,280 A * | 1/1954 | Lane et al. | ................. | 414/805 |
| 5,800,876 A | 9/1998 | Borner | | |
| 2005/0019106 A1* | 1/2005 | Moser | ......................... | 406/73 |

FOREIGN PATENT DOCUMENTS

GB 2049491 A 4/1980

OTHER PUBLICATIONS

1996 Powder Coating Advertisement for Sep. 17-19, 1996 Conference Proceedings.

Powder Coated Method of Power Delivery Control (pp. 183-195).

User's Guide to Powder Coating—Second Edition (pp. 68-70).

Ramseier Technologies (7 pages).

PCT—WO 03/024612 A1.

MAC Equipment—Dense Phase Conveying (2 pages).

Smoot—Dry Bulk Material Handling Systems—Dense Phase Conveying Concept (5 pages).

Smoot—Dry Bulk Material Handling Systems—Single Vessle Dense Phase Batch (5 pages).

European Search Report dated Mar. 2, 2005.

* cited by examiner

*Primary Examiner*—Philippe Derakshani
(74) *Attorney, Agent, or Firm*—Niro, Scavone, Haller & Niro

(57) ABSTRACT

The present invention is directed to a powder paint delivery method and apparatus employing a pressurized reservoir pump that supplies a controlled stream of densely fluidized or dense phase powder paint to the applicator though a powder delivery conduit. The powder flow rate is a function of the pressure in the reservoir and the flow resistance from the reservoir to the applicator, and is therefore very stable over time, and simple to control. The powder flow can be controlled by holding the resistance of the powder flow path constant and varying the pressure in the reservoir, or by holding the reservoir pressure constant and varying the resistance of the powder flow path.

10 Claims, 3 Drawing Sheets

POWDER TRANSPORT METHOD AND APPARATUS

BACKGROUND OF THE INVENTION

The present invention relates generally to the application of powder coatings. More particularly, this invention relates to the controlled delivery of powder paint to a spray applicator.

Currently powder paint is supplied to the applicator by a venture pump that first pulls powder from a fluidizing hopper via negative pressure generated by compressed air flowing through a venturi, then transports the powder pneumatically in a dilute phase condition to the spray applicator through a relatively large hose (typically 9–11 mm diameter), at relatively high velocity (typically 15 m/sec). Significant variation in powder flow is inherent to venturi based systems due to their sensitivity to changing conditions (hose length, back pressure, feed hopper pressure etc.) The current venturi based powder pump technology is being pushed to the edge of its operating envelope as a result of increasingly stringent control and output and requirements.

There are also a number of disadvantages associated with venturi based systems. For example, they are limited in maximum flow rate by practical hose size and supply pressure to the venturi. Additionally, significant variation in powder flow is inherent to venturi based systems due to their sensitivity to changing conditions (hose length, back pressure, feed hopper pressure etc.) and wear of the venturi due to erosion. Variations in powder flow over time causes unacceptable variation in the thickness of the applied powder coating or resulting paint film. Venturi pump systems also use significant quantities of costly conditioned compressed air. They require frequent preventative maintenance both in the form of venturi replacement due to wear, and hose cleaning due to the deposition of powder on the hose walls typical of dilute phase powder transport. Finally, venturi pumps impart enough energy into the powder paint to cause measurable degradation in the mechanical characteristics of the powder.

It would therefore be advantageous to have a powder paint delivery method and apparatus that provides a very consistent supply of powder paint to the applicator without the inconvenience and cost of frequent maintenance and venturi replacement, that uses minimal compressed air, and imparts only low forces on the powder to minimize or eliminate damage caused by the transporting process.

SUMMARY OF THE INVENTION

The present invention is therefore directed to a powder paint delivery method and apparatus employing a pressurized reservoir pump apparatus that supplies a controlled stream of densely fluidized or dense phase powder paint to the applicator though a powder delivery conduit. The powder flow rate is a function of the pressure in the reservoir and the flow resistance from the reservoir to the applicator, and is therefore very stable over time, and simple to control. The powder flow can be controlled by holding the resistance of the powder flow path constant and varying the pressure in the reservoir, or by holding the reservoir pressure constant and varying the resistance of the powder flow path. There are no wearing control surfaces to cause variation in flow over time due to erosion.

The present invention does not use a gas, eg air, to produce dilute phase flow as does a venturi system, rather the gas, eg air, is used to fluidize the powder, and/or to pressurize the pump apparatus. The quantity of compressed gas consumption is substantially less than that of existing technologies.

Because the powder paint en route from the pump apparatus to the applicator is in a dense phase state, flow rate changes at the pump are quickly translated to the applicator because the dense phase powder flow is not highly compressible.

The pump apparatus is sized such that multiple pumps can be mounted on a robot carriage in a multi-color powder system, thus minimizing the tubing length between the pump apparatus and the applicator. This arrangement minimizes the lag time experienced during flow rate changes, which allows greater flexibility in programming automatic application systems such as robots.

BRIEF DESCRIPTION OF THE DRAWING

The novel features which are characteristic of the present invention are set forth in the appended claims. However, the invention's preferred embodiments, together with further objects and attendant advantages, will be best understood by reference to the following detailed description taken in connection with the accompanying drawings in which:

DETAILED DESCRIPTION OF THE PREFERRED EMBODIMENTS

Figure 1:
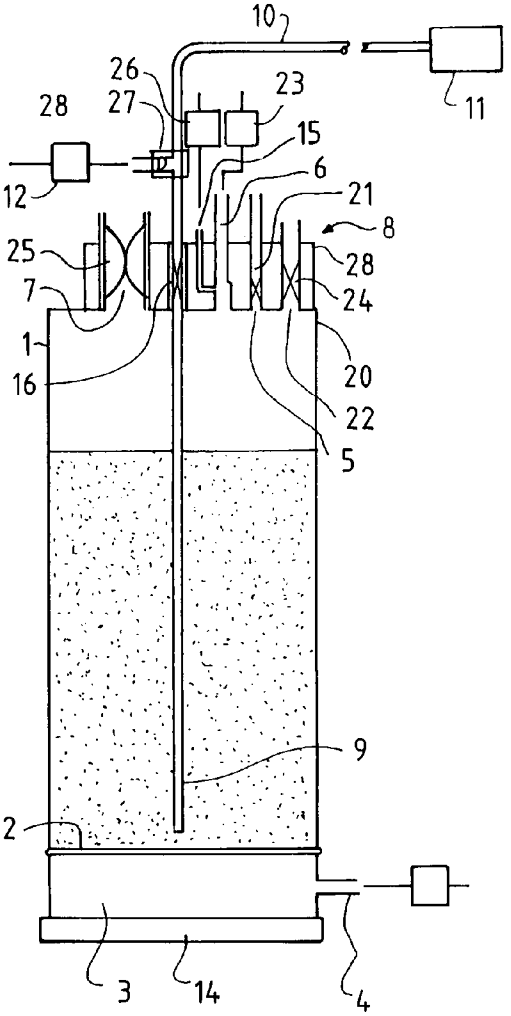
FIG. 1 is a schematic cross-sectional view showing operational components of one embodiment of the present invention.

Referring to FIG. 1, a cross-section of the powder pump apparatus is generally shown. A powder reservoir 1 is bounded on the bottom by a air-permeable wall or fluidizing sheet 2 and associated fluidizing air plenum 3, and bounded on the top by an air-tight cover 20. The reservoir and plenum thus form a vessel or receptacle which houses the powder with wall 2 defining the reservoir 1 above the wall and the fluidizing air plenum 3 below. The fluidizing plenum 3 has a compressed air supply inlet 4 where controlled fluidizing air is introduced. The fluidizing air source is preferably but not necessarily volumetrically controlled to eliminate variations in fluidizing air flow due to pressure variation within the pump reservoir 1. Such control of the fluidizing air flow may be accomplished by a critical office, an air mass-flow meter and controller, or other means well known in the art.

Figure 2:
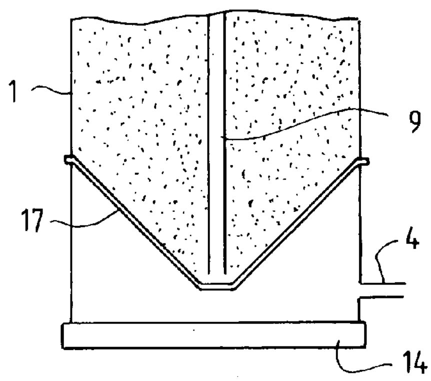
FIGS. 2–4 are partial cross-sectional views similar to FIG. 1 but showing alternative embodiments for particular fluidized bed arrangements useful in the practice of the present invention.
Figure 3:
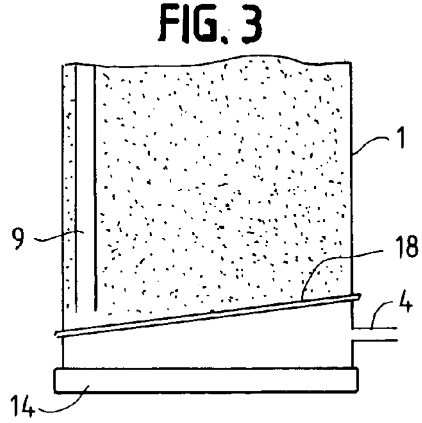
Figure 4:
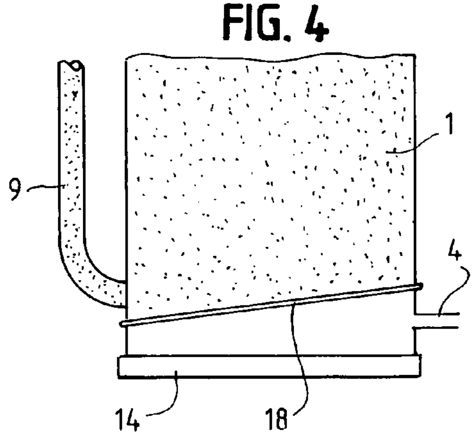

Alternate arrangements for the fluidizing sheet and reservoir can be seen in FIG. 2–4. In FIG. 2, the fluidizing sheet 17 is in the form of a cone to minimize the residual volume of powder in the pump when it is "empty". In FIG. 3, the fluidizing sheet 18 is sloped to one side of the pump reservoir 1 and the powder pick-up tube 9 is located near the wall of the pump reservoir 1. In FIG. 4, the pick tube 9 is shown exterior to the reservoir 1 and entering at a point near the fluidizing sheet 18. It will be obvious to those skilled in the art that other arrangements are possible to perform the same function.

Again referring to FIG. 1, in the preferred embodiment a valve assembly 8 which is mounted to the cover 20 or near the top of the pump reservoir 1 includes some or all of the following devices: a control air inlet 6 and associated pressure regulator 23, a vent port 5 with associated flow restrictor 21, a process fill vent 22 and associated valve 24, a powder fill port 7 and associated valve 25, pressure sensing port 15 and associated pressure transducer 26, at least one powder pick-up tube 9, and at least one trigger valve 12.

One or more powder delivery tubes 10 communicate with the associated powder pick-up tube 9 through associated shut-off control valves 16. For clarity only one powder pick-up tube 9 has been shown, but multiple powder pick-up tubes could be used to supply multiple applicators or proceseses. In the preferred embodiment, the individual valves, or valve assembly 8 if so integrated, are removable from the reservoir 1 for ease of maintenance or replacement. The powder pick-up tube 9 extends into the reservoir 1 to a point just above (typically 1–3 cm) the fluidizing sheet 2. Optionally the powder pick-up tube 9 could be exterior to the reservoir 1 and pass through the reservoir sidewall at a similar level above the fluidizing sheet 2.

The vent port 5 has a restriction device 21 such as a back-pressure regulator, an orifice or needle valve, or a mechanically adjustable pinch valve. The preferred method of restriction is an orifice. The purpose of the vent 5 is to allow a portion of the fluidizing air and control air (if used), to be exhausted from the reservoir 1. The vent 5 must have a resistance such that an adequate positive operating pressure can be maintained in the reservoir 1. The operating pressure in the pump reservoir will typically, but not necessarily, be in the range of 1 to 12 psi gauge (about $6\times10^3$ Pa to $80\times10^3$ Pa) pressure, according to the flow rate required and the diameter and length of the delivery tube 10. The restriction of the vent 5 may be set such that the fluidizing air volume is sufficient to produce the desired operating pressure within the reservoir 1, either alone or in combination with additional air introduced through the control air port 6. Thus, one or both of these controlled pressurized air sources will control the pressure inside the reservoir 1 to the desired operating pressure. In the preferred embodiment the control air supply is via a closed loop pressure control device such as an air pressure regulator or a closed loop pressure transducer. The pressure feedback measurement location 15 should be close to the inlet to the pump reservoir 1 so that the control device is sensing the actual pressure within the reservoir 1. However, the pressure feedback location is preferably not inside the pump reservoir 1, so it will not be fouled or plugged with powder. If the control air is not used, the pump reservoir pressure can be controlled by varying the fluidizing air volume, or the vent 5 resistance, or both.

A powder inlet valve 7 is fitted to the inlet of the reservoir 1 to allow powder to be introduced into the reservoir 1. The powder inlet valve 7 is preferably a pneumatically operated pinch valve, but other types of valves could be utilized. In the case of any malfunction of the pressure control system, the inlet pinch valve 7 of the preferred embodiment can also function as a pressure relief valve. In addition to the fill valve 7, and to facilitate quick powder loading, the process fill vent 22 and associated valve 24 may also be used to allow air to escape the reservoir 1 during the filing process.

The shut-off valve 16 (eg a pinch valve) is positioned along the delivery tube 10 to block powder flow completely. In the preferred embodiment the shut-off valve 16 is located at the end of the delivery tube 10 adjacent reservoir 1. Additionally, the trigger valve 12 may be used in conjunction with an air injection device 27 located between the shut-off valve 16 and the applicator 11, to allow controlled pressurized air to be injected into the delivery tube 10 at a pressure substantially equal to, or marginally higher than the pressure inside the reservoir. This injected air stops the flow of powder into the pick-up tube 9 and also purges residual powder from the powder flow path downstream from injection device 27. The combination of a trigger valve 12 and shut-off control valve 16 allows for the delivery tube to be purged of residual powder when the powder flow is stopped. A check valve 28 may be incorporated with the trigger valve 12 to eliminate powder from flowing into the valve 12 when the compressed air is shut off to allow powder to flow. In the preferred embodiment the compressed air supply to the trigger valve 12 is controlled via a closed loop pressure control device (now shown) such as an air pressure regulator or a closed loop pressure transducer.

If more than one applicator or process is fed from one reservoir 1, an alternate control method is possible so that different mass flow rates can be delivered to each applicator via a plurality of delivery tubes. Rather than controlling the mass flow rate directly with reservoir pressure, mass flow rate from each pick-up tube 9 and through each delivery tube 10, can be controlled by holding the reservoir pressure constant, and adjusting the restriction imposed by the valve 16 by partial closure of the valve. Alternatively, the powder flow can be modulated by injecting air through the trigger valve 12 at a pressure lower than reservoir pressure, thereby increasing the flow resistance of each delivery tube 10.

Figure 5:
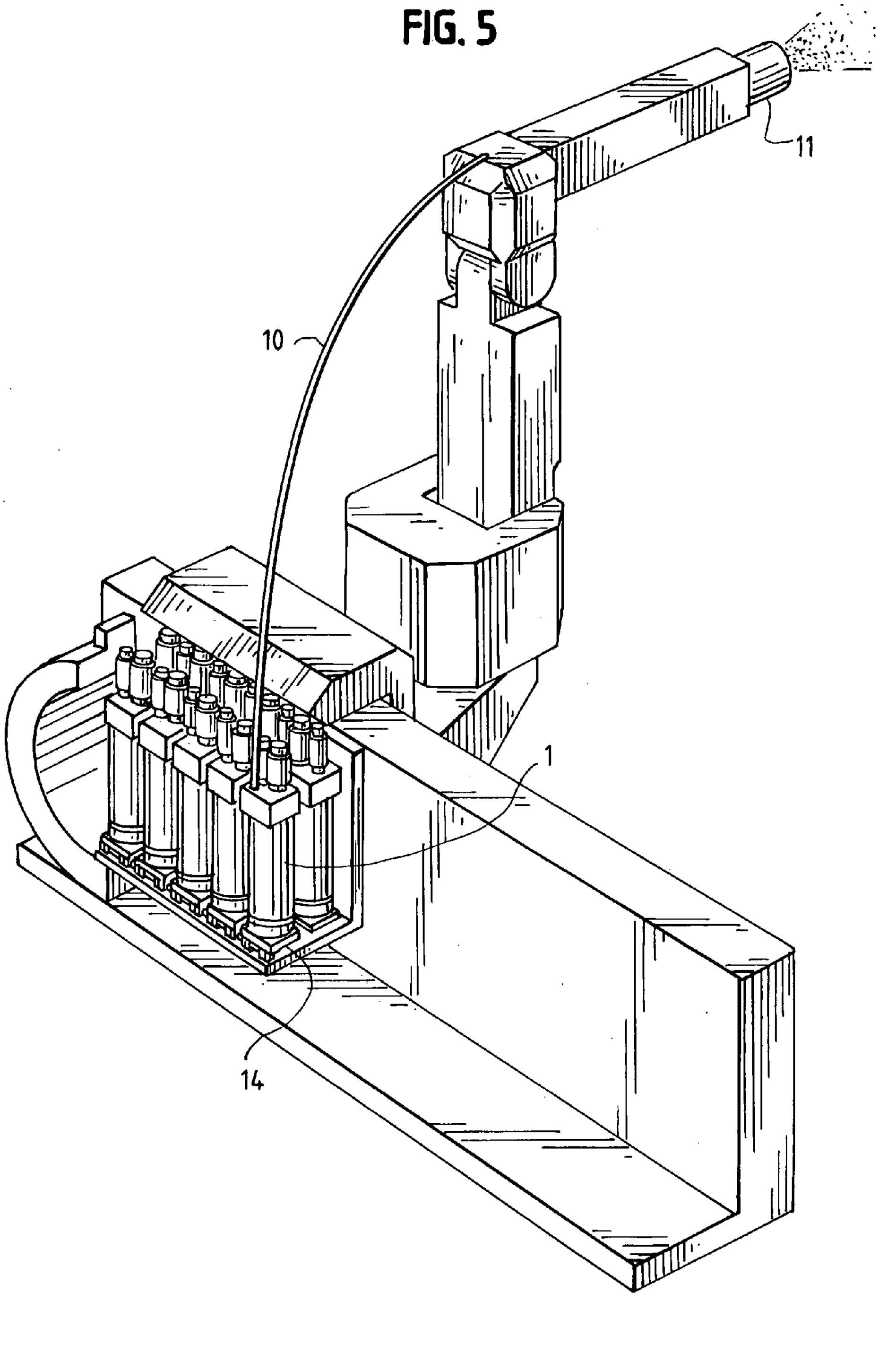
FIG. 5 is perspective view illustrating the paint powder delivery apparatus of the present invention as typically mounted in association with a powder spray applicator and robotic arm and carriage.
Figure 6:
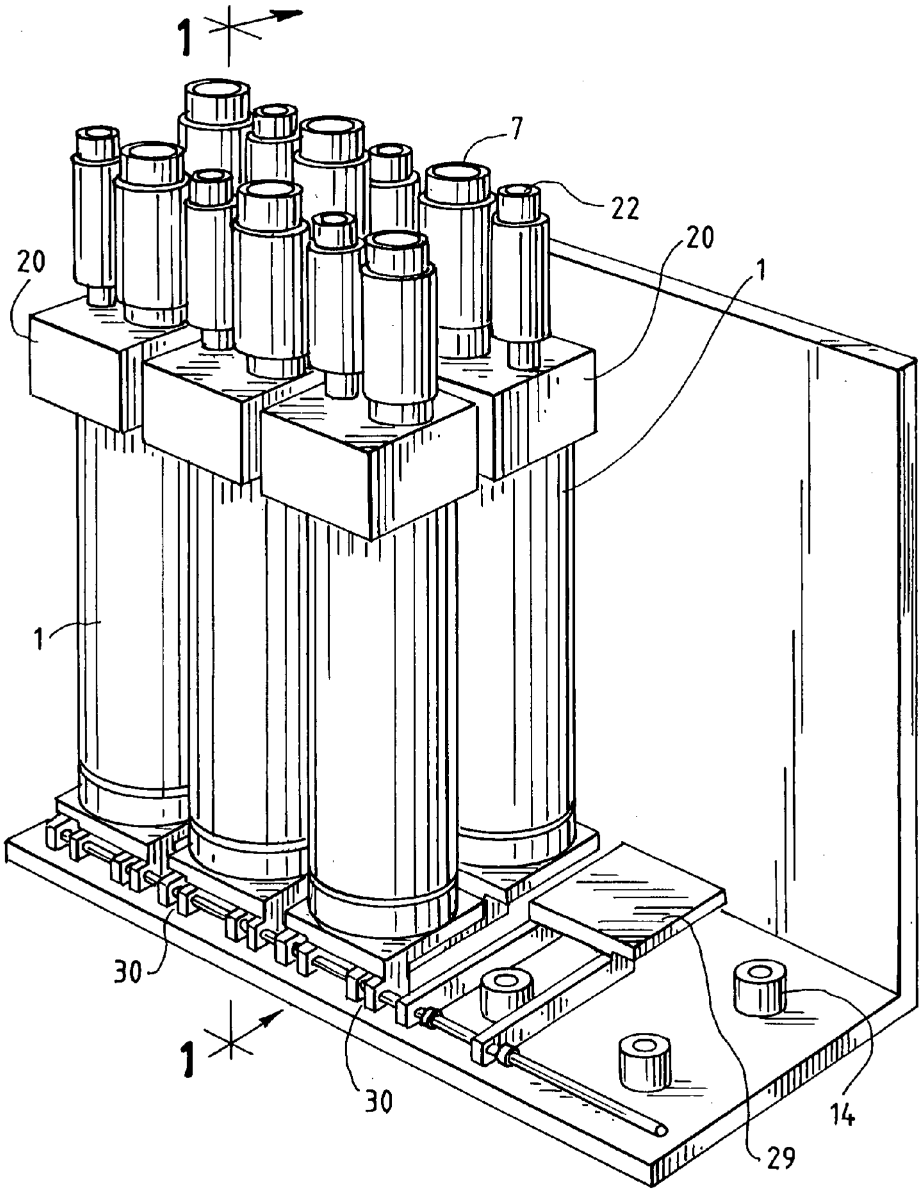
FIG. 6 is another perspective view similar to that of FIG. 5 but showing details of the mounting arrangement for the apparatus of the present invention.

As shown in FIGS. 5 and 6, the pump apparatus may be mounted to a load cell or scale 14 so the quantity of powder material in the pump reservoir 1 may be monitored. If the pump apparatus or a plurality of them are mounted on an "X-rail" robot or moving platform as shown in FIGS. 5 and 6, a support bracket 29 may be used to prevent loads caused by platform acceleration to be transferred to the load cell or scale 14. The support bracket 29 negates acceleration induced loads from being transferred to the load cell or scale 14, by incorporating an integrated hinge 30 oriented such that the hinge axis is parallel to the direction of the platform acceleration.

The following description will explain the general operation of the preferred embodiments.

Powder is loaded into the reservoir 1 through the powder fill port 7. Powder can be loaded in batches or continuously, with or without depressurizing the reservoir according the design of the loading system. Powder can be loaded through the inlet port by gravity, or by a pump or airlock located exterior to the reservoir, and a supply tube that supplies powder to the reservoir. If the pump is mounted to a robot, the powder can be loaded form a fixed loading station that is positioned such that the robot can move to a position under or adjacent to the loading station, to allow temporary connection to the loading station for filing the pump reservoir.

The reservoir is sized to accommodate a volume of powder sufficient to coat a predetermined number of painted objects between filling cycles. The powder in the reservoir is maintained in a fluidized state by the introduction of compressed air through a porous plate 2 and the supply plenum 3 affixed in the base of the reservoir 1. The pressure in the reservoir 1 can be controlled by a pressure control device such as a back-pressure regulator through which the fluidizing air must exhaust. Alternatively, the pressure in the reservoir 1 is controlled by a compressed air source independent of the fluidizing air, working in connection with an exhaust flow restrictor. This secondary control is introduced above the fluidized powder within the reservoir so that the control air does not join the fluidizing air in traveling through or "fluidizing" the powder. This arrangement allows for independent control fo the fluidized powder density and pump reservoir pressure. Fluidized powder from the reservoir is drawn into an applicator delivery conduit because of the pressure differential between the pump reservoir and the applicator delivery conduit outlet.

Powder flow rate is proportional to the pressure within the reservoir and inversely proportional to the total resistance of the powder supply path. Flow rate control is possible by controlling the pressure in the reservoir 1, and/or by a variable restriction in the delivery tube 10, as the flow rate through the delivery tube 10 is based on a combination of reservoir pressure and flow path pressure resistance. Flow rate monitoring and control may be accomplished by a control system that utilizes weight feedback from the scale supporting the pump apparatus. Measuring weight loss during a fixed time interval allows for the calculation of real-time powder mass flow rate. In response to the feedback from the scale 14, a control system can make adjustments to the pressure inside the reservoir by varying the pressure of the control air supply, thus adjusting the mass flow rate of the powder leaving the reservoir. Alternatively, the control system can make adjustments to a variable resistance device in the powder supply path to control the mass flow rate of the powder leaving the reservoir 1. The powder pickup tube 9 is in fluid communication with the delivery tube 10 which tube 10 terminates in an applicator 11. The tubes 9 and 10 are alternatively referred to as a delivery conduit.

Shutting the powder flow completely can be accomplished by a total restriction of the delivery tube 10. Alternative, powder shut-off can accomplished by the trigger valve 12 that introduces compressed air into the applicator supply tube 10 at a point between the pump and the applicator, at a pressure higher than the reservoir pressure. This injected air from the trigger valve 12 will both stop the flow of powder, and also purge the delivery tube 10 of residual powder. As long as the trigger air continues to be introduced into the delivery tube 10, powder will not flow into the powder pick-up tube 9. It is also possible to control the mass flow of the powder through the delivery tube 10 by introducing trigger air at a pressure less than the reservoir 1 pressure, so that the powder flow is not shut off, but reduced based on the effective increase in the total resistance of the delivery tube 10.

In the operation of the present invention, the powder is transported in "dense phase" which is defined herein to mean that the powder mass flow is at least ten times greater than the associated air mass flow. However, the powder to air ratio can be much greater, in the range of 80:1 to 100:1. Although in a dense phase, the power being transported through the delivery conduit (pick-up tube 9 and delivery tube 10) is preferably maintained in a fluidized state while transported. This permits a substantially greater uniformity of powder flow rate to the applicator, generally within plus or minus five percent, or even plus or minus two percent, of the predetermined or set point flow rate. Although a variety of delivery and pickup tube sizes can be employed, smaller sizes are preferred and delivery tubes having internal diameters less than 5 mm have been found particularly suitable when the operating pressures within the pump reservoir are set at between 3 and 10 psi gauge (about $20\times10^3$ Pa to $70\times10^3$ Pa), and preferably at least 5 psi (about $35\times10^3$ Pa).

The following are typical properties and characteristics for the kinds of powder paints that may be used in the practice of the present invention:

| | |
|---|---|
| Mean particle size: | 25–30 microns |
| Minimum particle size: | 5 microns |
| Maximum particle size: | 50 microns |
| Specific gravity: | 0.9–1.2 |
| Bulk density: | 25–30 $Lb/Ft^3$ |
| Fluidized density: | 10–20 $Lb/Ft^3$ |
| Material composition: | Polyester, Epoxy, Polyester/epoxy hybrid, Acrylic |

As noted previously, because the paint powder velocity in dense phase flow is relatively low, the potential for impact fusion within the delivery conduit is significantly reduced in the practice of the present invention. This allows greater flexibility in the geometry of the design of the delivery conduit and arrangement of components in the system. It also reduces the potential for maintenance or replacement of clogged or restricted delivery conduit.

Although reference has been made to the use of air as the fluidizing medium and as the pressurizing medium, it is of course contemplated in the practice of the present invention that gas other than air may be employed. For example, in the event the powder material may be adversely effected by contact with oxygen, then an inert gas such as nitrogen may be employed in the pace of air.

It will also be appreciated by those skilled in the art that various changes and modifications can be made to the illustrated embodiments without departing from the spirit of the present invention. All such modifications and changes are intended to be covered by the appended claims.

We claim:

1. A method for transporting paint powder to a paint applicator comprising:

providing a volume of paint powder housed in a receptacle;

maintaining the receptacle at an elevated pressure;

fluidizing the paint powder within the receptacle;

transporting the paint powder in a dense phase from the receptacle to the applicator through a delivery conduit, said conduit having a powder pick-up end positioned within the volume of fluidized paint powder in the receptacle and a delivery end in communication with the applicator; and regulating the pressure in the receptacle by the controlled introduction into the receptacle of both fluidizing gas and a control gas independent of fluidizing gas to thereby achieve a predetermined paint powder flow rate to the applicator.

2. The method of claim 1 wherein the mass flow rate of the paint powder transported from the receptacle is determined by measuring the weight loss of the receptacle and the pressure within the reservoir is adjusted in response to the weight loss measurement.

3. The method of claim 1 wherein a plurality of delivery conduits are employed to transport paint powder from the receptacle to a plurality of applicators.

4. The method of claim 3 wherein the flow rate of the paint powder to each of the applicators is controlled by maintaining a generally constant pressure within the receptacle and independently adjusting the paint powder flow path resistance through each of the delivery conduits.

5. The method of claim 1 wherein the paint powder flow rate to the applicator is maintained within a range of two percent of the predetermined flow rate.

6. The method of claim 1 wherein the pressure within the receptacle is elevated to at least 5 psi.

7. A powder pump apparatus for transporting powder to a powder coating applicator, comprising;

a vessel suitable for pressurization and having an air-permeable wall that defines a powder reservoir in the vessel above the wall and a fluidizing air plenum below the wall;

a first controlled source of pressurized air in communication with the plenum to both fluidize the powder contained in the reservoir and pressurize the reservoir;

a second controlled source of pressurized air in communication with the reservoir for pressurizing the reservoir;

said vessel also having an inlet for loading powder into the reservoir and a restricted outlet to allow air to be exhausted from the reservoir while providing sufficient airflow resistance for pressurization of the reservoir; and a powder delivery conduit having a powder pickup end positioned within the fluidized powder in the reservoir and a delivery end in communication with the applicator.

8. The powder pump apparatus of claim 7 further comprising a pressure sensor having an output signal indicative of pressure within the reservoir, and a weight sensor having an output signal indicative of the weight of the receptacle; said first and/or second controlled source of pressurized air being controlled in response to said pressure output signal and said weight output signal.

9. The powder pump apparatus of claim 7 further comprising a shutoff valve associated with the delivery conduit.

10. The powder pump apparatus of claim 7 further comprising a third controlled source of pressurized air in communication with the delivery conduit between the reservoir and applicator, said third controlled source of pressurized air being operable to reduce or prevent the flow of powder to the receptacle.

* * * * *